(12) United States Patent
Araki et al.

(10) Patent No.: US 6,489,045 B1
(45) Date of Patent: Dec. 3, 2002

(54) ORGANIC ELECTROLUMINESCENCE DEVICE

(75) Inventors: Yasushi Araki, Kanagawa-ken (JP); Masayuki Okaniwa, Saitama-ken (JP)

(73) Assignees: Fuji Photo Film Co., LTD, Kanagawa-ken (JP); Fuji Photo Optical Co., Ltd., Saitama-ken (JP)

( * ) Notice: Subject to any disclaimer, the term of this patent is extended or adjusted under 35 U.S.C. 154(b) by 0 days.

(21) Appl. No.: 09/617,027

(22) Filed: Jul. 14, 2000

(30) Foreign Application Priority Data

Jul. 16, 1999 (JP) .............................. 11-203950

(51) Int. Cl.[7] .......................... H05B 33/00; H05B 33/02

(52) U.S. Cl. ...................... 428/690; 313/506; 313/509; 257/102

(58) Field of Search ................................ 428/690, 917; 313/502–506, 509; 257/102

(56) References Cited

U.S. PATENT DOCUMENTS

| 5,723,873 | A | * | 3/1998 | Yang | 257/40 |
| 5,986,391 | A | * | 11/1999 | Feldman | 313/326 |
| 6,030,700 | A | * | 2/2000 | Forrest et al. | 428/336 |
| 6,207,301 | B1 | * | 3/2001 | Ohnishi et al. | 428/690 |
| 6,280,861 | B1 | * | 8/2001 | Hosokawa et al. | 428/690 |
| 6,309,763 | B1 | * | 10/2001 | Woo et al. | 428/690 |

FOREIGN PATENT DOCUMENTS

| JP | 07022649 A | 1/1995 |
| JP | 11067460 A | 3/1999 |

* cited by examiner

*Primary Examiner*—Dawn L. Garrett
(74) *Attorney, Agent, or Firm*—Sughrue Mion, PLLC

(57) ABSTRACT

An organic electroluminescence device comprising a pair of electrodes and at least one organic compound layer disposed therebetween, wherein at least one of the electrodes is a light-transmittable electrode exhibiting a light-transmittance peak centered in a range of an emission peak wavelength of the device ±100 nm, and the light-transmittance peak has a half band width of 1 to 350 nm.

4 Claims, 8 Drawing Sheets

ORGANIC ELECTROLUMINESCENCE DEVICE

BACKGROUND OF THE INVENTION

The present invention relates to an organic electroluminescence device exhibiting a high power efficiency.

An organic electroluminescence device, hereinafter referred to as "an organic EL device", can be comparatively easily produced as a surface luminescence device by a vapor deposition method, a coating method, etc., thereby considered to be useful for a flat panel display. The organic EL device has been widely studied, and such that providing an excellent performance equal to an inorganic LED has been developed in recent years.

The organic EL device ordinarily comprises a pair of electrodes. Since the organic EL device acts as a surface luminescence device, at least one of the electrodes generally has a low resistance and a high light-transmittance. Well known as such an electrode is, for example, an electrode of ITO (Indium Tin Oxide) where indium oxide is doped with tin (see, Japanese Patent Laid-Open No. 11-67460). Nevertheless, it has been desired to develop an electrode having a lower resistance and more efficient light-transmitting characteristics than those of known electrodes, and an organic EL device comprising the electrode to exhibit a higher power efficiency as compared with the prior art.

OBJECT AND SUMMARY OF THE INVENTION

An object of the present invention is to provide an organic EL device exhibiting a high power efficiency.

As a result of intense research in view of the above object, the inventors have found that an organic EL device comprising a light-transmittable electrode having specific light-transmitting characteristics is excellent in the power efficiency. The present invention has been accomplished by the finding.

Thus, an organic EL device of the present invention comprises a pair of electrodes and at least one organic compound layer disposed therebetween, wherein at least one of the electrodes is a light-transmittable electrode exhibiting a light-transmittance peak centered in a range of an emission peak wavelength of the device ±100 nm, and the light-transmittance peak has a half band width of 1 to 350 nm.

The organic EL device of the present invention provides a further improved power efficiency by satisfying the following conditions (1) to (4).
(1) It is preferable that the light-transmittable electrode has a surface resistance of 15 Ω/square or less.
(2) It is preferable that the light-transmittable electrode is a multi-layered thin film composed of preferably 2 or more materials, more preferably 3 or more materials.
(3) It is preferable that the light-transmittable electrode is mainly composed of ITO, indium oxide, tin oxide, and/or an indium oxide-zinc oxide alloy.
(4) It is preferable that the organic EL device emits light by applying a pulse voltage having a pulse width of $10^{-9}$ to $10^{-3}$ second.

DETAILED DESCRIPTION OF THE PREFERRED EMBODIMENTS

Figure 1:
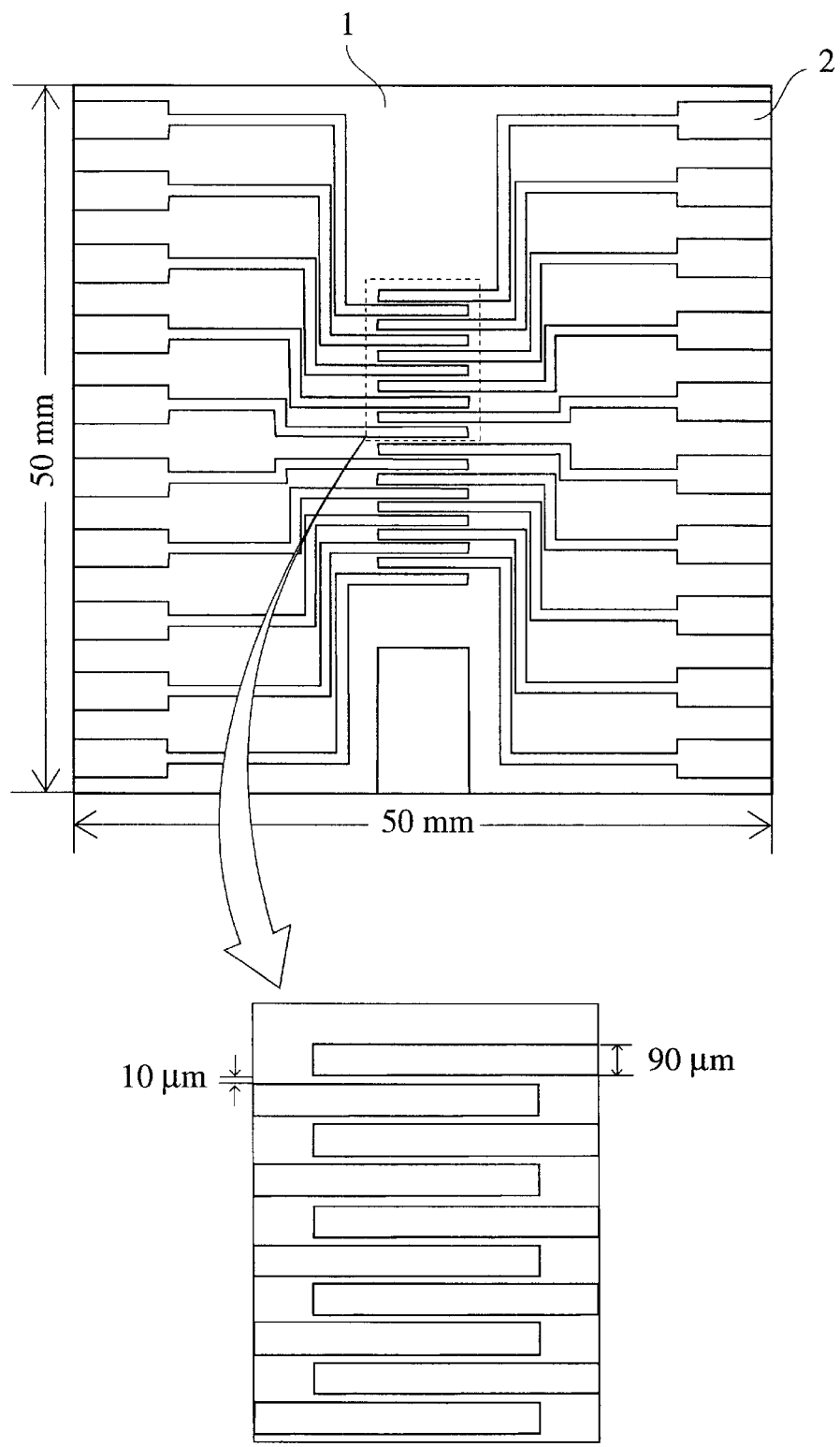
FIG. 1 is a schematic view showing an example of a patterned positive electrode in accordance with an organic EL device of the present invention.

An organic EL device of the present invention comprises a pair of electrodes and at least one organic compound layer disposed therebetween. The organic EL device preferably has a multi-layer structure disposed on a substrate. Specific examples of the multi-layer structure include: positive electrode/light-emitting layer/negative electrode; positive electrode/hole-transporting layer/light-emitting layer/negative electrode; positive electrode/light-emitting layer/electron-transporting layer/negative electrode; positive electrode/hole-transporting layer/light-emitting layer/electron-transporting layer/negative electrode; the reversed structure thereof; etc. A hole-injecting layer, an electron-injecting layer, etc. may be further provided. The organic EL device may comprise a plurality of the hole-transporting layers, the light-emitting layers or the electron-transporting layers.

Furthermore, an electrically conductive polymer layer may be disposed on the positive electrode. The electrically conductive polymer layer is provided to make the organic compound layer thicker with little increase of required driving voltage, thereby preventing luminance-irregularity and short circuit.

It is preferred that the organic EL device of the present invention has a micro-optical resonator structure (microcavity structure). The micro-optical resonator type organic EL device shows an emission peak with a narrow half band width, being excellent in emission directivity. This organic EL device is constituted of, for example, a dielectric mirror, a transparent electrode (a positive electrode), at least one organic compound layer and a back electrode (a negative electrode) disposed in this order on a transparent substrate, as described in "Organic EL Display", pp. 105 (Technotimes Co., a separate volume of "Monthly Display", the October issue of 1998). Therein, the micro-optical resonator is formed between the dielectric mirror and the back electrode serving as a metal mirror. In general, the dielectric mirror is composed of two types of layers such as $SiO_2$ layers and $TiO_2$ layers laminated alternately, and each of the layers has an optical length designed to be ¼ of the emission wavelength of the organic EL device. The entire thickness of the micro-optical resonator may be adjusted by interposing a $SiO_2$ spacer between the dielectric mirror and the transparent electrode of ITO, etc.

The organic compound layer of the organic EL device may be disposed by a known method such as a vacuum vapor deposition method, a sputtering method, a dipping method, a spin-coating method, a casting method, a bar-coating method, a roll-coating method, etc. Further, the organic compound layers may be formed by multi-layer coating while appropriately selecting solvent for each layer. On the other hand, the inorganic layer such as the electrode may be disposed by a known method such as a vacuum vapor deposition method, a sputtering method, an ion-plating method, etc.

Patterning the electrode, especially the light-transmittable electrode, is preferably carried out by a chemical etching method such as a photolithography or a physical etching method using laser, etc. Also, the electrode may be patterned by vacuum vapor deposition, sputtering, etc. while masking.

The organic EL device of the present invention is particularly suitable for the case of applying a pulse voltage having a pulse width of $10^{-9}$ to $10^{-3}$ second to emit light. Though the organic EL device may be used as a single picture element, it is preferable that the device is used as a dot-array in which a plurality of the picture elements are arranged in lines according to each emitting color. The picture elements of each color may form one line or a plurality of lines. The size of the picture element is preferably 10 to 500 μm, more preferably 50 to 300 μm.

The layers in the organic EL device according to the present invention will be described in detail below.

[1] Electrode

The organic EL device of the present invention comprises a pair of electrodes, and at least one of the electrodes is light-transmittable electrode. The electrode capable of transmitting light is generally referred to as "transparent electrode". However, because the light-transmittable electrode used in the present invention is not required to have a high light-transmittance over the entire visible wavelength region, such an electrode is hereinafter referred to as "EL-transmittable electrode". The EL-transmittable electrode for use herein has a high light-transmittance in the emission wavelength range of the organic EL device. Specifically, if the emission peak wavelength of the organic EL device is expressed by $\lambda_{EL}$, the light-transmittance peak wavelength $\lambda_T$ of the EL-transmittable electrode is in the range of $\lambda_{EL} \pm 100$ nm, preferably $\lambda_{EL} \pm 50$ nm, more preferably $\lambda_{EL} + 20$ nm.

The EL-transmittable electrode used in the present invention exhibits the light-transmittance peak with a half band width of 1 to 350 nm. To further improve the power efficiency of the organic EL device, the half band width is preferably 1 to 300 nm, more preferably 1 to 150 nm.

A luminous efficiency of the organic EL device is increased by suppressing the surface resistance of the EL-transmittable electrode to a low level. The surface resistance of the EL-transmittable electrode is preferably 15 Ω/square or less, more preferably 5 Ω/square or less, particularly preferably 1 Ω/square or less, most preferably 0.1 Ω/square or less. To lower the surface resistance, it is preferable that the EL-transmittable electrode is a multi-layered thin film composed of preferably 2 or more materials, more preferably 3 or more materials. The material for the EL-transmittable electrode is not particularly limited, and any materials which act as an electrode may be used. It is preferred that the EL-transmittable electrode is mainly composed of ITO, indium oxide, tin oxide and/or an indium oxide-zinc oxide alloy. Also, a metal thin film of gold, platinum, silver-magnesium, etc. may be used as the material for the EL-transmittable electrode. Further, organic materials such as polyaniline, polythiophene, polypyrrole and derivatives thereof may be used therefor.

In the case where the positive electrode is EL-transmittable, the negative electrode is preferably made of a material having a small work function from the view point of electron-injecting properties. Examples of such a material include: an alkali metal such as Li and K; an alkali earth metal such as Mg and Ca; etc. Stable materials with a high oxidation resistance such as Al, etc. are also preferable. The negative electrode may be composed of 2 or more materials in order to obtain both the excellent electron-injecting properties and high stability (see, Japanese Patent Laid-Open No. 2-15595, Japanese Patent Laid-Open No. 5-121172, etc.).

On the other hand, in the case where the negative electrode is EL-transmittable, the positive electrode may be made of a well-known material such as ITO, tin oxide, an indium oxide-zinc oxide compound, etc. Because the positive electrode does not need to be light-transmittable in this case, any electrically conductive materials may be used as the material therefor. The positive electrode is preferably made of a material with a large work function such as gold, platinum, etc. in this case.

[2] Light-Emitting Layer

The light-emitting layer of the organic EL device according to the present invention may have electron-transporting or hole-transporting ability. The light-emitting layer comprises at least one kind of light-emitting material. The light-emitting material used in the present invention is not particularly limited and any materials that emit fluorescence when excited may be used. Examples of the light-emitting material include oxinoid compounds, perylene compounds, coumalin compounds, azacoumalin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazoline compounds, pyrazolone compounds, rhodamine compounds, chrysene compounds, phenanthrene compounds, cyclopentadiene compounds, stilbene compounds, diphenylquinone compounds, styryl compounds, distyrylbenzene compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, xanthene compounds, thioxanthene compounds, cyanine compounds, acridine compounds, acridone compounds, quinoline compounds, metal complexes of 8-hydroxyquinoline compounds, beryllium complexes of benzoquinolinol compounds, metal complexes of 2,2'-bipyridine compounds, group III metal complexes of Schiff bases, metal complexes of oxadiazole compounds, rare earth metal complexes, etc.

The above-mentioned light-emitting materials may be used singly or jointly. The light-emitting materials may be used as a dispersion, in which the light-emitting material is molecularly dispersed in a carrier-transporting polymer, or in which the light-emitting material and a low molecular weight carrier-transporting material are molecularly dispersed in a polymer not having a carrier-transporting ability. The term "low molecular weight carrier-transporting material" used herein means an electron-transporting (electron-accepting) or hole-transporting (electron-donative) low molecular weight material. The term "polymer not having a carrier-transporting ability" used herein means an electrically inactive polymer such as poly(methyl methacrylate), poly(methyl acrylate), polystyrene, polycarbonate, etc.

Light-emitting polymer materials are also preferably used as the light-emitting material. Examples of the light-emitting polymer material include: π-conjugated polymers such as poly-p-phenylenevinylene, polyfluorene, polythiophene and derivatives thereof; polymers comprising a low molecular weight dye, and tetraphenyldiamine or triphenylamine in main- or side-chain thereof; etc. The light-emitting polymer material may be used as a mixture with the low molecular weight light-emitting material mentioned above.

[3] Substrate

In the present invention, plastics may be used as a material for the substrate in addition to glasses. It is preferable that the plastic material used for the substrate is excellent in heat resistance, dimensional stability, solvent resistance, electrical insulating properties and processing characteristics, and has low gas permeability and moisture adsorption. Examples of the plastic material include polyethylene terephthalate, polybutylene terephthalate, polyethylene naphthalate, polystyrene, polycarbonate, polyethersulfone, polyarylate, allyldiglycol carbonate, polyimide, etc.

On the substrate is preferably disposed a layer for inhibiting moisture from permeating therethrough and/or a gas barrier layer. Such layers are preferably made of an inorganic compound such as silicon nitride and silicon oxide. These layers may be formed by a radio frequency sputtering method, etc. A hard coat layer or a under coat layer may be also disposed, if necessary.

[4] Hole-Transporting Layer

Examples of the hole-transporting material for use in the hole-transporting layer include poly-N-vinylcarbazole derivatives, polyphenylenevinylene derivatives, polyphenylene, polythiophene, polymethylphenylsilane, polyaniline, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, carbazole derivatives, styrylanthracene derivatives, fluorenone derivatives, hydrazone derivatives, stilbene derivatives, porphyrin derivatives such as phthalocyanine derivatives, aromatic tertiary amine compounds, styrylamine compounds, butadiene compounds, benzidine derivatives, polystyrene derivatives, triphenylmethane derivatives, tetraphenylbenzene derivatives, starburst polyamine derivatives etc.

[5] Electron-Transporting Layer

Examples of the electron-transporting material for use in the electron-transporting layer include oxadiazole derivatives, triazole derivatives, triazine derivatives, nitro-substituted fluorenone derivatives, thiopyran dioxide derivatives, diphenylquinone derivatives, tetracarboxylperylene derivatives, anthraquinodimethane derivatives, fluorenylidenemethane derivatives, anthrone derivatives, perynone derivatives, oxine derivatives, derivatives of quinoline complexes, etc. On the electron-transporting layer is generally disposed the negative electrode. A thin layer made of aluminum oxide, lithium fluoride, etc. having a thickness of approximately 0.01 to 10 nm may be interposed between the electron-transporting layer and the negative electrode.

[6] Electrically Conductive Polymer Layer

Preferable as the electrically conductive polymer material for use in the electrically conductive polymer layer are polyaniline derivatives, polythiophene derivatives and polypyrrole derivatives described in WO 98/05187, etc. These materials may be used as a mixture with a protonic acid such as camphorsulfonic acid, p-toluenesulfonic acid, styrenesulfonic acid and polystyrenesulfonic acid, and/or other polymer such as poly(methyl methacrylate) (PMMA), poly(N-vinylcarbazole) (PVCz), etc. The electrically conductive polymer layer preferably has a surface resistance of 10000 $\Omega$/square or less. The thickness of this layer is preferably 10 to 1000 nm, more preferably 20 to 200 nm.

[7] Others

On the outer surface of the negative electrode, a protective layer described in Japanese Patent Laid-Open No. 7-85974, etc. may be formed for blocking moisture and air. Also, the outside of the organic EL device is preferably sealed by glass or a poly(chlorotrifluoroethylene) sheet. A desiccating agent, a water repellent fluorine-based inert liquid, etc. may be interposed into the organic EL device.

It is preferred that a sealing layer is disposed in the organic EL device to prevent permeation of moisture or oxygen therethrough. Examples of a material for the sealing layer include: copolymers of tetrafluoroethylene and at least one comonomer; fluorine-containing copolymers having a cyclic structure in the main chain; polyethylene; polypropylene; poly(methyl methacrylate); polyimides; polyureas; polytetrafluoroethylene; polychlorotrifluoroethylene; polydichlorodifluoroethylene; copolymers of chlorotrifluoroethylene and dichlorodifluoroethylene; mixtures of a moisture-absorbing substance having a water absorption of 1% or more and moisture-resistant substance having that of 0.1% or less; metals such as In, Sn, Pb, Au, Cu, Ag, Al, Ti, Ni, etc.; metal oxides such as MgO, SiO, $SiO_2$, $Al_2O_3$, GeO, NiO, CaO, BaO, $Fe_2O_3$, $Y_2O_3$, $TiO_2$, etc.; metal fluorides such as $MgF_2$, LiF, $AlF_3$, $CaF_2$, etc.; and liquid fluorinated carbons such as perfluoroalkanes, perfluoroamines, perfluoroethers, etc. in which an adsorbent for adsorbing moisture or oxygen may be dispersed.

EXAMPLES

The organic EL device of the present invention comprising the light-transmittable positive electrode will be described in more detail below with reference to EXAMPLES. Incidentally, the principle of the invention is the same in the case of the organic EL device comprising the light-transmittable negative electrode.

Comparative Example 1

Figure 3:
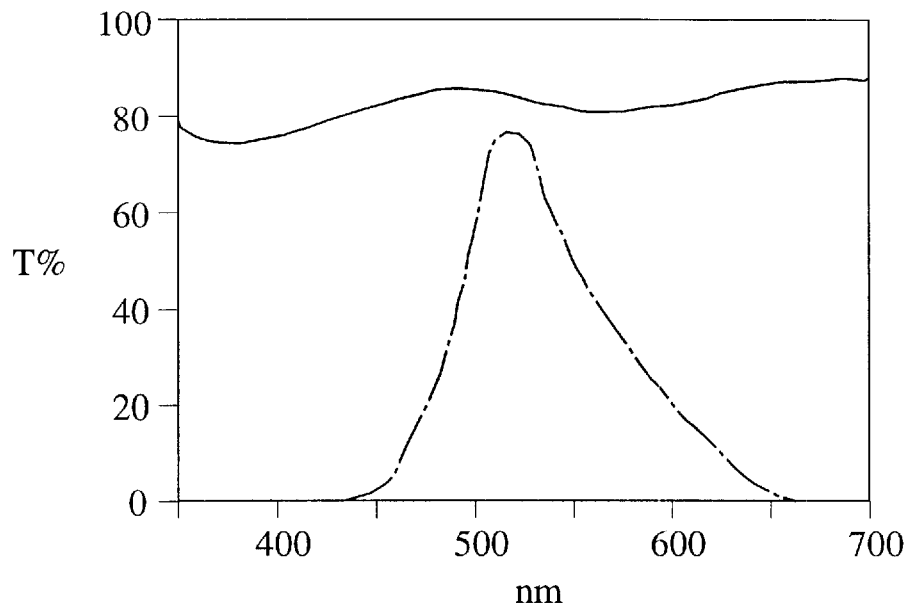
FIG. 3 is a graph showing an emission spectrum illustrated by a broken line and a light-transmittance of a positive electrode illustrated by a solid line in accordance with the organic EL device of COMPARATIVE EXAMPLE 1.

A glass substrate 50mm×50 mm in size was washed with ultrasonic wave in a mixture of acetone, Semico Clean (Furuuchi Kagaku Co.) and isopropyl alcohol (IPA). The substrate was further washed by boiling in IPA and treated with $UV/O_3$ washing. This washed substrate 1 shown in FIG. 1 was then placed in a sputtering chamber, and ITO was sputtered to a thickness of 0.2 μm thereon. The sputtered ITO was then patterned by photolithography to form a positive electrode 2 shown in FIG. 1. The surface resistance of the positive electrode was 20 Ω/square. Incidentally, the surface resistance was measured by four-terminal method in the present invention. The light-transmittance of the positive electrode is illustrated in FIG. 3 by a solid line.

Figure 2:
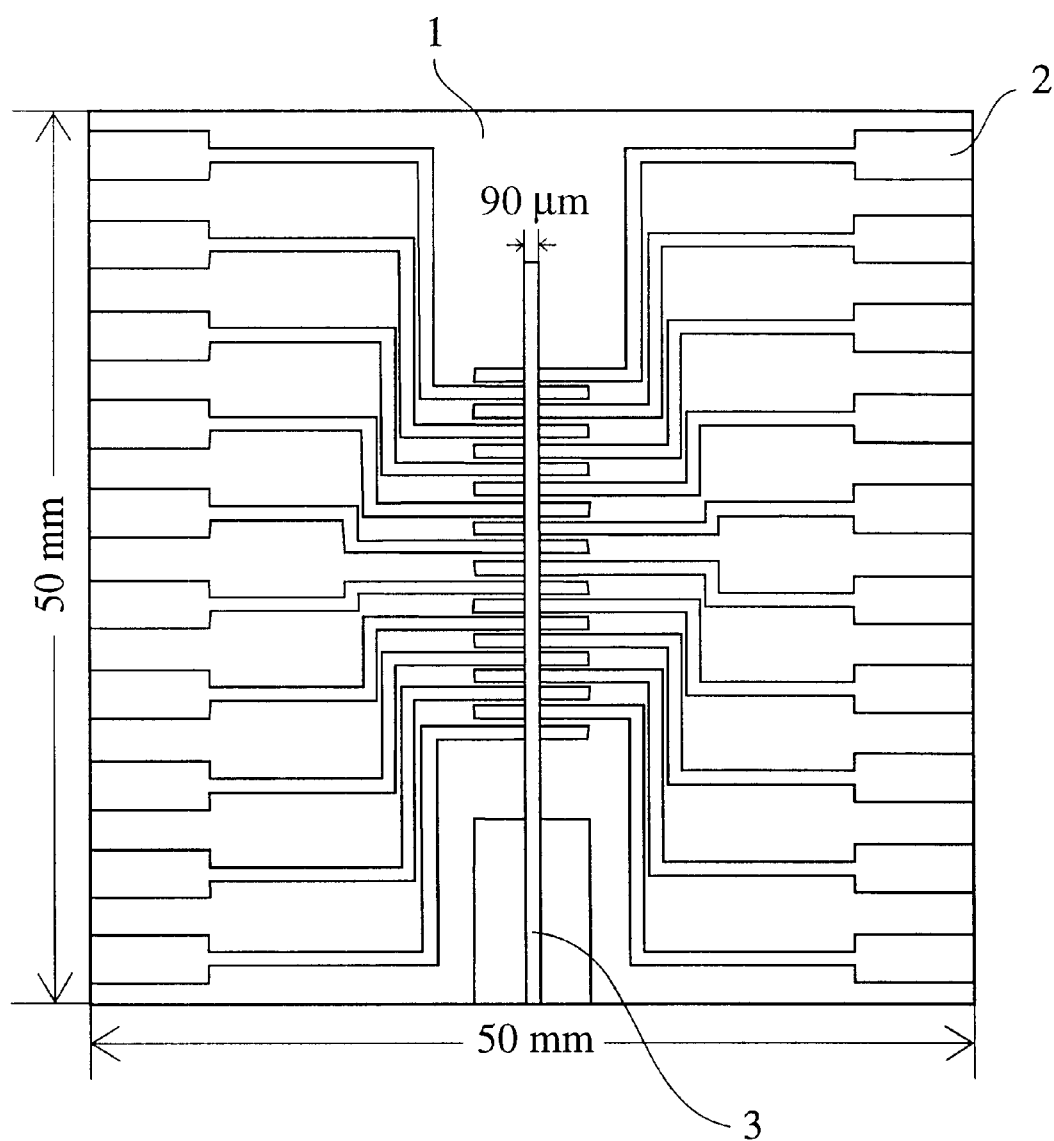
FIG. 2 is a schematic view showing an example of a patterned positive electrode and negative electrode in accordance with an organic EL device of the present invention.

On the obtained ITO positive electrode was vapor deposited N,N'-bis(3-methylphenyl)-(1,1'-biphenyl)-4,4'-diamine (TPD) at a rate of 3 to 4 Å/second to a thickness of 400 Å as a hole-transporting layer, and thereon was further vapor deposited tris(8-quinolinolato) aluminum (Alq) at a rate of 3 to 6 Å/second to a thickness of 600 Å as a light-emitting layer. Next, an Mg/Ag alloy (molar ratio: Mg/Ag=10/1) was vapor deposited to a thickness of 0.6 μm on the light-emitting layer while masking, thereby forming a negative electrode 3 shown in FIG. 2. Further, on the negative electrode was vapor deposited Ag in 0.5 μm thickness to prepare the organic EL device of COMPARATIVE EXAMPLE 1. The emission spectrum of the organic EL device is illustrated in FIG. 3 by a broken line.

Comparative Example 2

Figure 4:
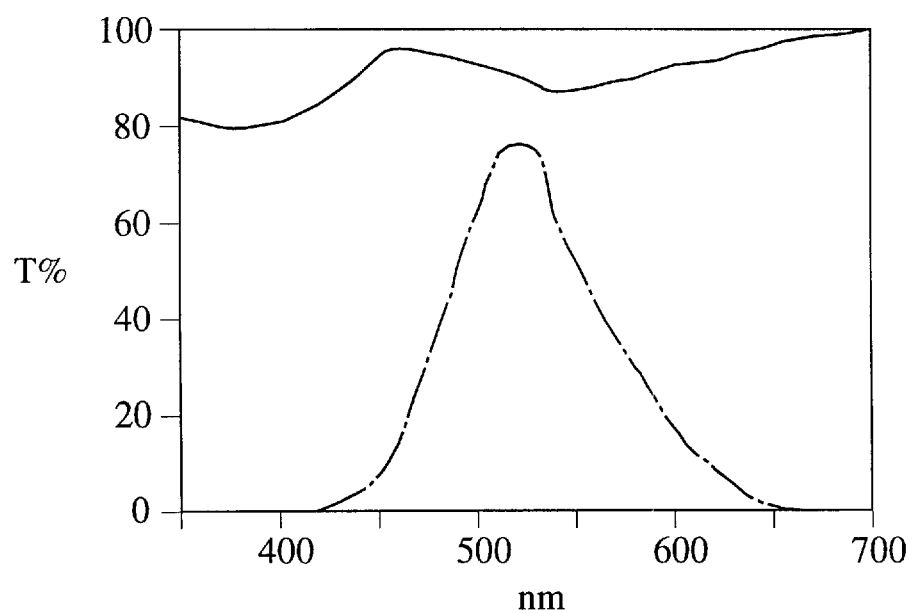
FIG. 4 is a graph showing an emission spectrum illustrated by a broken line and a light-transmittance of a positive electrode illustrated by a solid line in accordance with the organic EL device of COMPARATIVE EXAMPLE 2.

The organic EL device of COMPARATIVE EXAMPLE 2 was prepared in the same manner as COMPARATIVE EXAMPLE 1 except that ITO was sputtered to a thickness of 0.1 μm on the substrate. The surface resistance of the positive electrode was 42.0 Ω/square. The emission spectrum illustrated by a broken line and the light-transmittance of the positive electrode illustrated by a solid line in accordance with the organic EL device of COMPARATIVE EXAMPLE 2 was shown in FIG. 4.

Example 1

Figure 5:
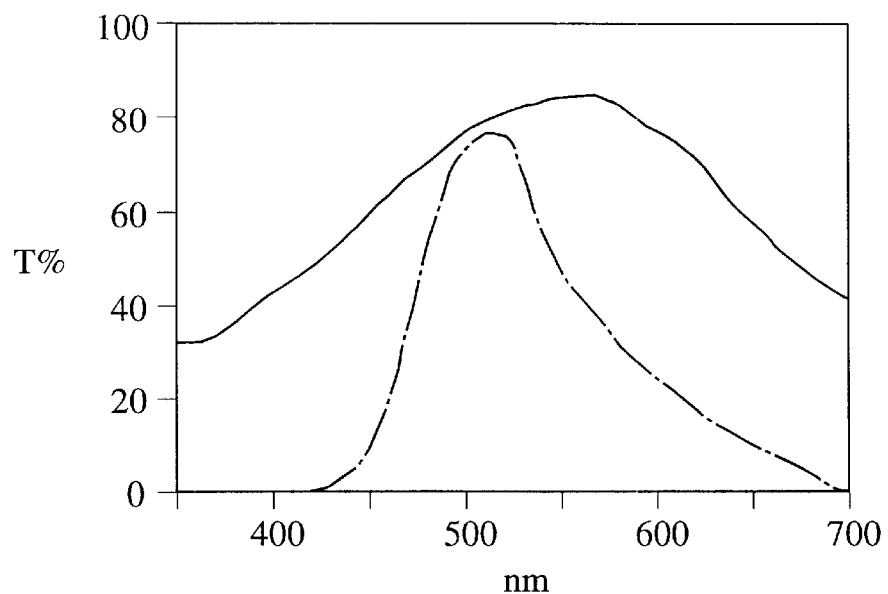
FIG. 5 is a graph showing an emission spectrum illustrated by a broken line and a light-transmittance of a positive electrode illustrated by a solid line in accordance with the organic EL device of EXAMPLE 1.

The organic EL device of EXAMPLE 1 was prepared in the same manner as COMPARATIVE EXAMPLE 1 except that on the above-described substrate was sputtered ITO to a thickness of 0.2 μm, vapor deposited Au to a thickness of 4 nm and sputtered ITO to a thickness of 0.2 μm in this order, and the resultant ITO/Au/ITO was patterned to form a positive electrode 2 shown in FIG. 1. The surface resistance of the positive electrode was 14.0 Ω/square. The emission spectrum illustrated by a broken line and the light-transmittance of the positive electrode illustrated by a solid line in accordance with the organic EL device of EXAMPLE 1 was shown in FIG. 5.

Example 2

Figure 6:
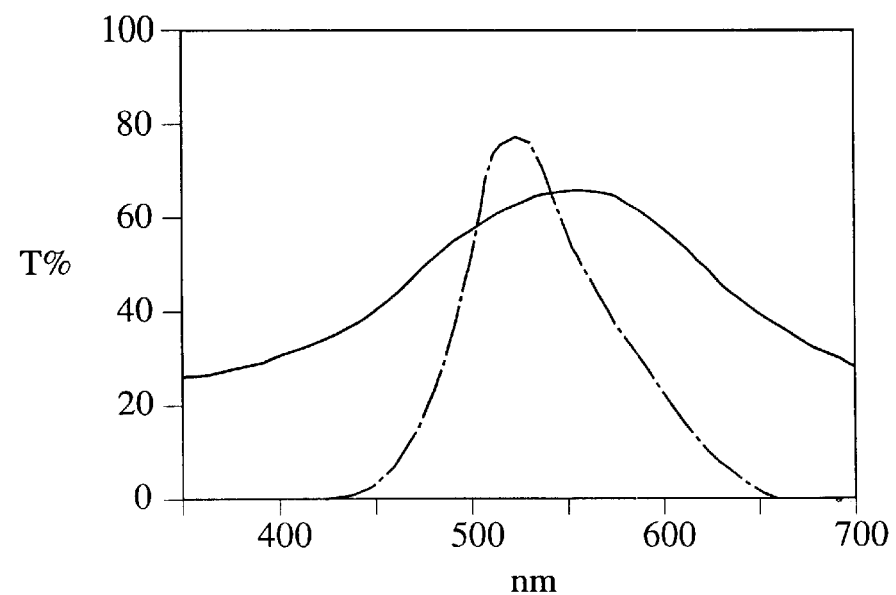
FIG. 6 is a graph showing an emission spectrum illustrated by a broken line and a light-transmittance of a positive electrode illustrated by a solid line in accordance with the organic EL device of EXAMPLE 2.

The organic EL device of EXAMPLE 2 was prepared in the same manner as COMPARATIVE EXAMPLE 1 except that on the above-described substrate was sputtered ITO to a thickness of 0.2 μm, vapor deposited Au to a thickness of 8 nm and sputtered ITO to a thickness of 0.2 μm in this order, and the resultant ITO/Au/ITO was patterned to form a positive electrode 2 shown in FIG. 1. The surface resistance of the positive electrode was 4.1 Ω/square. The emission spectrum illustrated by a broken line and the light-transmittance of the positive electrode illustrated by a solid line in accordance with the organic EL device of EXAMPLE 2 was shown in FIG. 6.

Example 3

Figure 7:
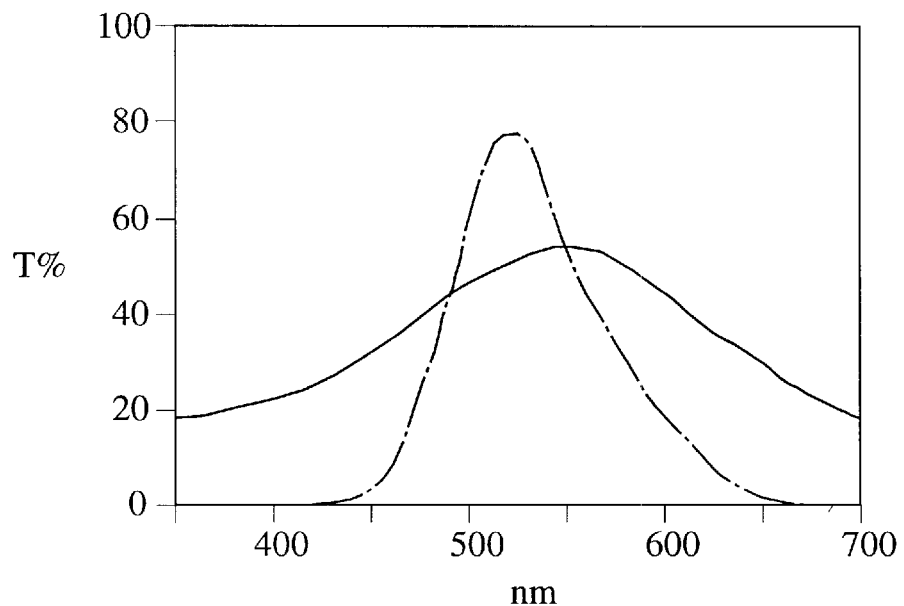
FIG. 7 is a graph showing an emission spectrum illustrated by a broken line and a light-transmittance of a positive electrode illustrated by a solid line in accordance with the organic EL device of EXAMPLE 3.

The organic EL device of EXAMPLE 3 was prepared in the same manner as COMPARATIVE EXAMPLE 1 except that on the above-described substrate was sputtered ITO to a thickness of 0.2 μm, vapor deposited Au to a thickness of 12 nm and sputtered ITO to a thickness of 0.2 μm in this order, and the resultant ITO/Au/ITO was patterned to form a positive electrode 2 shown in FIG. 1. The surface resistance of the positive electrode was 0.12 Ω/square. The emission spectrum illustrated by a broken line and the light-transmittance of the positive electrode illustrated by a solid line in accordance with the organic EL device of EXAMPLE 3 was shown in FIG. 7.

Example 4

Figure 8:
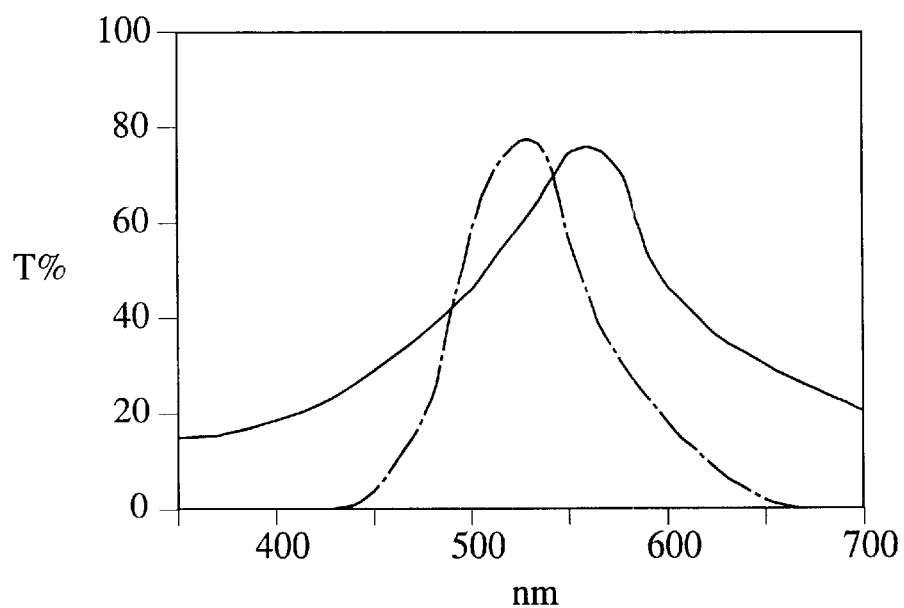
FIG. 8 is a graph showing an emission spectrum illustrated by a broken line and a light-transmittance of a positive electrode illustrated by a solid line in accordance with the organic EL device of EXAMPLE 4.

The organic EL device of EXAMPLE 4 was prepared in the same manner as COMPARATIVE EXAMPLE 1 except that on the above-described substrate was sputtered ITO to a thickness of 0.2 μm, vapor deposited Au to a thickness of 4 nm, sputtered ITO to a thickness of 0.1 μm, vapor deposited Au to a thickness of 4 nm and sputtered ITO to a thickness of 0.1 μm in this order, and the resultant ITO/Au/ITO/Au/ITO was patterned to form a positive electrode 2 shown in FIG. 1. The surface resistance of the positive electrode was 4.8 Ω/square. The emission spectrum illustrated by a broken line and the light-transmittance of the positive electrode illustrated by a solid line in accordance with the organic EL device of EXAMPLE 4 was shown in FIG. 8.

Example 5

Figure 9:
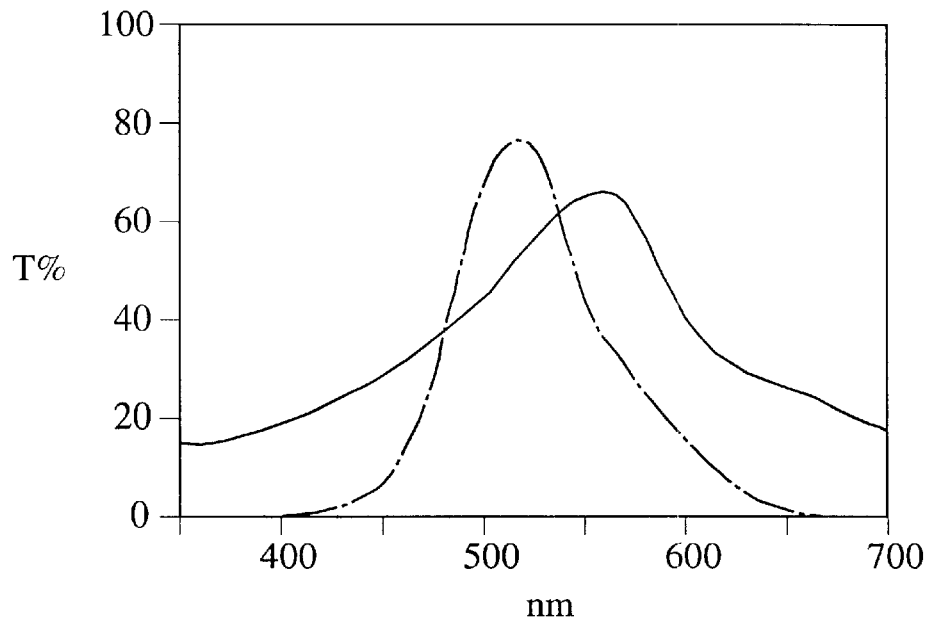
FIG. 9 is a graph showing an emission spectrum illustrated by a broken line and a light-transmittance of a positive electrode illustrated by a solid line in accordance with the organic EL device of EXAMPLE 5.

The organic EL device of EXAMPLE 5 was prepared in the same manner as COMPARATIVE EXAMPLE 1 except that on the above-described substrate was sputtered ITO to a thickness of 0.2 μm, vapor deposited Au to a thickness of 4 nm, sputtered ITO to a thickness of 0.1 μm, vapor deposited Au to a thickness of 8 nm and sputtered ITO to a thickness of 0.1 μm in this order, and the resultant ITO/Au/ITO/Au/ITO was patterned to form a positive electrode 2 shown in FIG. 1. The surface resistance of the positive electrode was 0.14 Ω/square. The emission spectrum illustrated by a broken line and the light-transmittance of the positive electrode illustrated by a solid line in accordance with the organic EL device of EXAMPLE 5 was shown in FIG. 9.

Example 6

Figure 10:
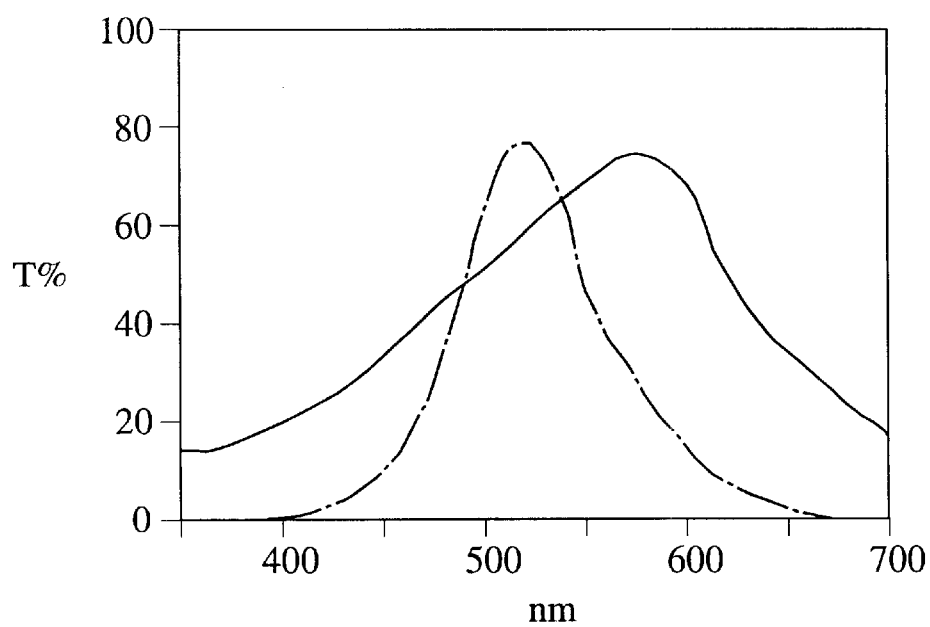
FIG. 10 is a graph showing an emission spectrum illustrated by a broken line and a light-transmittance of a positive electrode illustrated by a solid line in accordance with the organic EL device of EXAMPLE 6.

The organic EL device of EXAMPLE 6 was prepared in the same manner as COMPARATIVE EXAMPLE 1 except that on the above-described substrate was sputtered ITO to a thickness of 0.2 μm, vapor deposited Au to a thickness of 4 nm, sputtered ITO to a thickness of 0.1 μm, vapor deposited Pt to a thickness of 8 nm and sputtered ITO to a thickness of 0.1 μm in this order, and the resultant ITO/Au/ITO/Pt/ITO was patterned to form a positive electrode 2 shown in FIG. 1. The surface resistance of the positive electrode was 0.11 Ω/square. The emission spectrum illustrated by a broken line and the light-transmittance of the positive electrode illustrated by a solid line in accordance with the organic EL device of EXAMPLE 6 was shown in FIG. 10.

Measurement of Power Efficiency

In the present invention, the power efficiency of the organic EL device was measured in the following manner. While changing voltage applied to the organic EL device, luminance and conducted current were measured to make a calibration curve showing a relation thereof. Herein, the luminance was measured by the luminance meter BM-5A manufactured by Topcon Co., and the current was detected by APD module C5460 manufactured by Hamamatsu Photonics K.K. Next, the organic EL device was applied rectangular wave voltage by function generator SG4111 manufactured by Iwatsu Electric Co., Ltd. such that the luminance was approximately 1000 cd/m$^2$. The pulse width of the voltage was $10^{-9}$ to $10^{-3}$ second. The luminous amount was detected by APD module C5460, and the luminous amount and the current were observed by oscillograph. The average electric discharge power was calculated from the current of 1 pulse, and the average luminance was found from the average current value in 1 pulse detected by APD module C5460 and the calibration curve to obtain the power efficiency of the organic EL device.

The power efficiencies of the organic EL devices according to COMPARATIVE EXAMPLES 1 and 2, and EXAMPLES 1 to 6 were obtained by the above-described manner. The results are shown in Table 1 together with the surface resistance of the positive electrode. Incidentally, 10 ms, 100 µs, 1 µs and 10 ns shown in Table 1 represent the voltage-applying time of 1 pulse.

TABLE 1

| | Surface Resistance | Power Efficiency (1 m/W) | | | |
|---|---|---|---|---|---|
| | (Ω/square) | 10 ms | 100 µs | 1 µs | 10 ns |
| Comp. Ex. 1 | 20.0 | 1.81 | 1.62 | 1.43 | 1.19 |
| Comp. Ex. 2 | 42.0 | 1.45 | 1.22 | 1.09 | 0.81 |
| Ex. 1 | 14.0 | 1.91 | 1.74 | 1.62 | 1.49 |
| Ex. 2 | 4.1 | 2.11 | 1.96 | 1.83 | 1.67 |
| Ex. 3 | 0.12 | 2.31 | 2.18 | 2.04 | 1.88 |
| Ex. 4 | 4.8 | 2.05 | 1.89 | 1.72 | 1.53 |
| Ex. 5 | 0.14 | 2.28 | 2.14 | 1.97 | 1.76 |
| Ex. 6 | 0.11 | 2.42 | 2.24 | 2.06 | 1.87 |

As shown in Table 1, the organic EL devices of the present invention according to EXAMPLES 1 to 6 exhibited higher power efficiency as compared with the conventional organic EL devices according to COMPARATIVE EXAMPLES 1 and 2. This seems because the organic EL device of the present invention is not required to comprise an electrode having a high light-transmittance over the entire visible wavelength region. Additionally, it was clear from Table 1 that the advantages of the present invention can be remarkably achieved under the condition of short voltage-applying time.

Comparative Example 3

Figure 11:
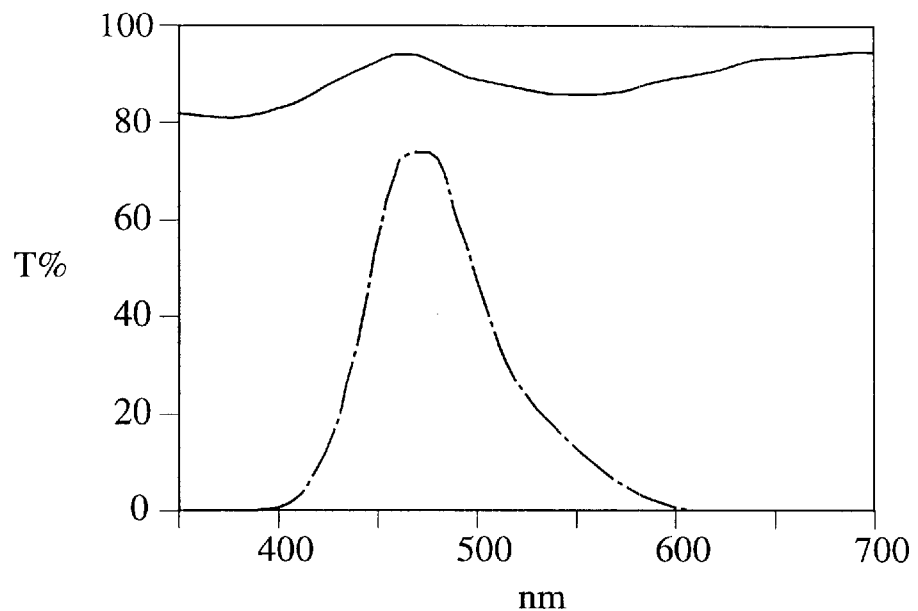
FIG. 11 is a graph showing an emission spectrum illustrated by a broken line and a light-transmittance of a positive electrode illustrated by a solid line in accordance with the organic EL device of COMPARATIVE EXAMPLE 3.

On the ITO positive electrode formed by the same manner as COMPARATIVE EXAMPLE 1 were vapor deposited copper phthalocyanine of 200 Å thickness, TPD of 600 Å thickness, 4,4'-bis(2,2'-diphenylvinyl)biphenyl (DPVBi) of 400 Å thickness and Alq of 200 Å thickness in this order. Next, an Mg/Ag alloy (molar ratio: Mg/Ag=10/1) was vapor deposited to a thickness of 0.6 µm on the Alq layer while masking, thereby forming a negative electrode 3 shown in FIG. 2. Further, on the negative electrode was vapor deposited Ag in 0.5 µm thickness to prepare the organic EL device of COMPARATIVE EXAMPLE 3. The emission spectrum illustrated by a broken line and the light-transmittance of the positive electrode illustrated by a solid line in accordance with the organic EL device of COMPARATIVE EXAMPLE 3 was shown in FIG. 11.

Example 7

Figure 12:
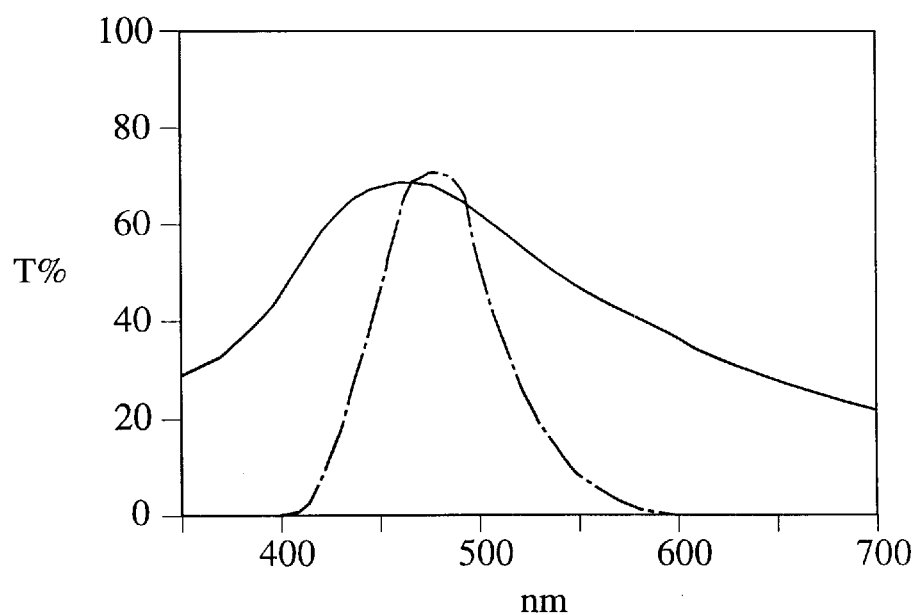
FIG. 12 is a graph showing an emission spectrum illustrated by a broken line and a light-transmittance of a positive electrode illustrated by a solid line in accordance with the organic EL device of EXAMPLE 7.

The organic EL device of EXAMPLE 7 was prepared in the same manner as COMPARATIVE EXAMPLE 3 except that on the above-described substrate was sputtered ITO to a thickness of 0.2 µm, vapor deposited Ag to a thickness of 8 nm and sputtered ITO to a thickness of 0.1 µm in this order, and the resultant ITO/Ag/ITO was patterned to form a positive electrode 2 shown in FIG. 1. The surface resistance of the positive electrode was 0.10 Ω/square. The emission spectrum illustrated by a broken line and the light-transmittance of the positive electrode illustrated by a solid line in accordance with the organic EL device of EXAMPLE 7 was shown in FIG. 12.

Example 8

Figure 13:
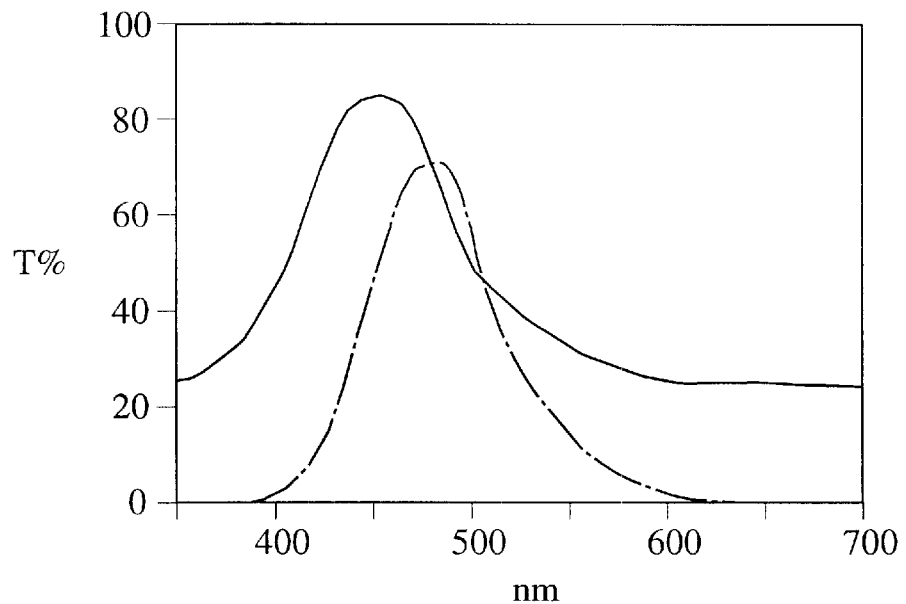
FIG. 13 is a graph showing an emission spectrum illustrated by a broken line and a light-transmittance of a positive electrode illustrated by a solid line in accordance with the organic EL device of EXAMPLE 8.

The organic EL device of EXAMPLE 8 was prepared in the same manner as COMPARATIVE EXAMPLE 3 except that on the above-described substrate was sputtered ITO to a thickness of 0.2 µm, vapor deposited Ag to a thickness of 4 nm, sputtered ITO to a thickness of 0.1 µm, vapor deposited Ag to a thickness of 4 nm and sputtered ITO to a thickness of 0.1 µm in this order, and the resultant ITO/Ag/ITO/Ag/ITO was patterned to form a positive electrode 2 shown in FIG. 1. The surface resistance of the positive electrode was 0.13 Ω/square. The emission spectrum illustrated by a broken line and the light-transmittance of the positive electrode illustrated by a solid line in accordance with the organic EL device of EXAMPLE 8 was shown in FIG. 13.

Example 9

Figure 14:
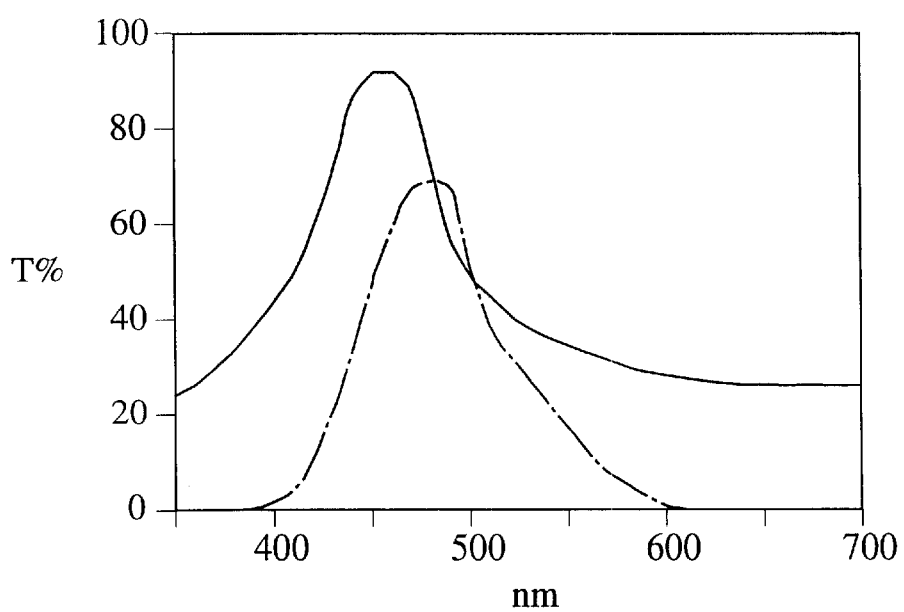
FIG. 14 is a graph showing an emission spectrum illustrated by a broken line and a light-transmittance of a positive electrode illustrated by a solid line in accordance with the organic EL device of EXAMPLE 9.

The organic EL device of EXAMPLE 9 was prepared in the same manner as COMPARATIVE EXAMPLE 3 except that on the above-described substrate was sputtered ITO to a thickness of 0.2 µm, vapor deposited Pt to a thickness of 4 nm, sputtered ITO to a thickness of 0.1 µm, vapor deposited Ag to a thickness of 4 nm and sputtered ITO to a thickness of 0.1 µm in this order, and the resultant ITO/Pt/ITO/Ag/ITO was patterned to form a positive electrode 2 shown in FIG. 1. The surface resistance of the positive electrode was 0.15 Ω/square. The emission spectrum illustrated by a broken line and the light-transmittance of the positive electrode illustrated by a solid line in accordance with the organic EL device of EXAMPLE 9 was shown in FIG. 14.

Measurement of Power Efficiency

The power efficiencies of the organic EL devices according to COMPARATIVE EXAMPLE 3 and EXAMPLES 7 to 9 were obtained by the above-described manner. The results are shown in Table 2 together with the surface resistance of the positive electrode. Incidentally, 10 ms, 100 µs, 1 µs and 10 ns shown in Table 2 represent the voltage applying time of 1 pulse.

TABLE 2

|  | Surface Resistance (Ω/square) | Power Efficiency (1 m/W) | | | |
| --- | --- | --- | --- | --- | --- |
|  |  | 10 ms | 100 μs | 1 μs | 10 ns |
| Comp. Ex. 3 | 20.0 | 1.32 | 1.11 | 0.90 | 0.73 |
| Ex. 7 | 0.10 | 1.44 | 1.25 | 1.14 | 1.04 |
| Ex. 8 | 0.13 | 1.52 | 1.36 | 1.24 | 1.11 |
| Ex. 9 | 0.15 | 1.55 | 1.38 | 1.26 | 1.14 |

As shown in Table 2, the organic EL devices of the present invention according to EXAMPLES 7 to 9 exhibited higher power efficiency as compared with the conventional organic EL devices according to COMPARATIVE EXAMPLE 3. This seems because the organic EL device of the present invention is not required to comprise an electrode having a high light-transmittance over the entire visible wavelength region. Additionally, it was clear from Table 2 that the advantages of the present invention can be remarkably achieved under the condition of short voltage-applying time.

As described in detail above, the organic EL device of the present invention comprising the light-transmittable electrode having specific light-transmitting characteristics is excellent in power efficiency.

What is claimed is:

1. An organic electroluminescence device comprising a positive electrode and a negative electrode, and at least one organic compound layer disposed therebetween, wherein said positive electrode is a light-transmittable electrode exhibiting a light-transmittance peak having a half band width of 1 to 350 nm, a light-transmittance peak wavelength $\lambda_T$ of said light-transmittance electrode is in a range of $\lambda_{EL} \pm 100$ nm, in which $\lambda_{EL}$ is an emission peak wavelength of said device, and said light-transmittable electrode is a multi-layered metal tin film composed of 2 or more materials.

2. The organic electroluminescence device according to claim 1, wherein said light-transmittable electrode has a surface resistance of 15 Ω/square or less.

3. The organic electroluminescence device according to claim 2, emitting light by applying a pulse voltage having a pulse width of $10^{-9}$ to $10^{-3}$ second.

4. The organic electroluminescence device according to claim 1, emitting light by applying a pulse voltage having a pulse width of $10^{-9}$ to $10^{-3}$ second.

* * * * *

UNITED STATES PATENT AND TRADEMARK OFFICE
CERTIFICATE OF CORRECTION

PATENT NO. : 6,489,045 B1
DATED : December 3, 2002
INVENTOR(S) : Yasushi Araki and Masayuki Okaniwa It is certified that error appears in the above-identified patent and that said Letters Patent is hereby corrected as shown below:

Column 12,
Lines 2-12, claim 1, should read as follows:

1. An organic electroluminescence device comprising a positive electrode and a negative electrode, and at least one organic compound layer disposed therebetween, wherein said positive electrode is a light-transmittable electrode exhibiting a light-transmittance peak having a half band width of 1 to 350 nm, a light-transmittance peak wavelength $\lambda_T$ of said light-transmittance electrode is in a range of $\lambda_{EL} \pm 100$nm, in which $\lambda_{EL}$ is and emission peak wavelength of said device, and said light-transmittable electrode is a multi-layered metal thin film composed of 2 or more materials having a layered structure selected from the group consisting of ITO/Au/ITO/Au/ITO, ITO/Au/ITO/Pt/ITO, ITO/Ag/ITO and ITO/Pt/ITO/Ag/ITO.

Signed and Sealed this

Twelfth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,489,045 B1
DATED : December 3, 2002
INVENTOR(S) : Yasushi Araki and Masayuki Okaniwa It is certified that error appears in the above-identified patent and that said Letters Patent is hereby corrected as shown below:

Column 12,
Lines 2-12, claim 1, should read as follows:

1. An organic electroluminescence device comprising a positive electrode and a negative electrode, and at least one organic compound layer disposed therebetween, wherein said positive electrode is a light-transmittable electrode exhibiting a light-transmittance peak having a half band width of 1 to 350 nm, a light-transmittance peak wavelength $\lambda_T$ of said light-transmittance electrode is in a range of $\lambda_{EL} \pm 100nm$, in which $\lambda_{EL}$ is and emission peak wavelength of said device, and said light-transmittable electrode is a multi-layered metal thin film composed of 2 or more materials having a layered structure selected from the group consisting of ITO/Au/ITO/Au/ITO, ITO/Au/ITO/Pt/ITO, ITO/Ag/ITO/Ag/ITO.

This certificate supersedes Certificate of Correction issued August 12, 2003.

Signed and Sealed this

Twenty-second Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,489,045 B1
DATED : December 3, 2002
INVENTOR(S) : Yasushi Araki and Masayuki Okaniwa It is certified that error appears in the above-identified patent and that said Letters Patent is hereby corrected as shown below:

Column 12,
Lines 2-12, claim 1, should read as follows:

1. An organic electroluminescence device comprising a positive electrode and a negative electrode, and at least one organic compound layer disposed therebetween, wherein said positive electrode is a light-transmittable electrode exhibiting a light-transmittance peak having a half band width of 1 to 350 nm, a light-transmittance peak wavelength $\lambda_T$ of said light-transmittance electrode is in a range of $\lambda_{EL} \pm 100$nm, in which $\lambda_{EL}$ is and emission peak wavelength of said device, and said light-transmittable electrode is a multi-layered metal thin film having a layered structure selected from the group consisting of
ITO/Au/ITO/Au/ITO, ITO/Au/ITO/Pt/ITO, ITO/Ag/ITO/Ag/ITO.

This certificate supersedes Certificate of Correction issued August 12, 2003 and June 22, 2004.

Signed and Sealed this

Twenty-sixth Day of July, 2005

JON W. DUDAS
*Director of the United States Patent and Trademark Office*